(12) United States Patent
Larson

(10) Patent No.: US 6,829,150 B2
(45) Date of Patent: Dec. 7, 2004

(54) EJECTOR LATCH INDICATOR LIGHT

(75) Inventor: Thane M. Larson, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/192,172

(22) Filed: Jul. 9, 2002

(65) Prior Publication Data

US 2004/0008500 A1 Jan. 15, 2004

(51) Int. Cl.⁷ .............................. H05K 7/14; H05K 7/18
(52) U.S. Cl. ................... 361/801; 361/726; 361/747; 361/754; 439/65; 439/74
(58) Field of Search ............................. 361/801, 732, 361/747, 754, 726, 759; 200/50 R; 211/41.17; 439/65, 74–76

(56) References Cited

U.S. PATENT DOCUMENTS

| | | | |
|---|---|---|---|
| 5,050,501 A | * | 9/1991 | Barditch et al. ............ 102/293 |
| 5,359,492 A | * | 10/1994 | Porter ........................ 361/683 |
| 6,220,879 B1 | | 4/2001 | Ulrich |
| 6,448,785 B1 | * | 9/2002 | Rohmer et al. ............. 324/550 |
| 6,473,300 B1 | * | 10/2002 | Youngquist et al. ........ 361/685 |
| 2003/0109157 A1 | | 6/2003 | Koerber |

FOREIGN PATENT DOCUMENTS

| | | |
|---|---|---|
| JP | 3296297 | 12/1991 |
| JP | 4274392 | 9/1992 |
| JP | 7058462 | 3/1995 |
| JP | 11307964 | 11/1999 |

* cited by examiner

*Primary Examiner*—Tulsidas Patel
*Assistant Examiner*—Hung S. Bui

(57) ABSTRACT

An ejector latch indicator light assembly for reducing the interference by a bulkhead of light emitted from an indicator light is disclosed. In one embodiment, the present invention is comprised of an ejector latch. The present embodiment is further comprised of an indicator light integrated with the ejector latch. The indicator light adapted to emit light from the ejector latch such that interference by the bulkhead of the light emitted from the indicator light is reduced.

22 Claims, 7 Drawing Sheets

EJECTOR LATCH INDICATOR LIGHT

TECHNICAL FIELD

The present claimed invention relates to the field of computer chassis structures. More specifically, the present claimed invention relates to an ejector latch indicator light employed in conjunction with computer chassis structures.

BACKGROUND ART

Presently, printed circuit assemblies (PCAs) are comprised of a substrate (e.g., PC board) with associated microcircuits. Typically, PCAs are used in conjunction with chassis structures to allow a large amount of processing ability to fit into a small space. In general, the chassis structure may contain a multiplicity of PCAs operating independently, in conjunction, or as a portion of a larger network. Often, the PCA is attached to the chassis type structure in conjunction with very specific standards. Typically, PCA attaching standards include, for example, the compact peripheral component interconnect (cPCI) standard, and the VersaModular Eurocard (VME) standard.

Typically, PCAs used in the chassis type structure fabricated to one of the above-mentioned standards (e.g., cPCI or VME) have indicator lights such as light-emitting diodes (LEDs) mounted on the printed circuit board (PCB). The LEDs are conventionally used to signal various states of the applications running on the PCA including, but not limited to: when the PCA is available for hot swapping, diagnostic states, and progress indicators. For example, the cPCI industry standard LED color for the hot swapping status of a PCA is blue. Therefore, if the light is on (or off, or blinking depending on the specification) the PCA is ready to be hot swapped. In addition to application state information such as indicating hot swapping status, LEDs may be used to indicate local area network (LAN) connectivity, connection speeds (e.g., 10 megabits, 100 megabits, 1000 megabits, etc.), power on or off, or the like.

Another utilization of the LED on a PCA is for identification. Specifically, if service personnel are working on a chassis and need to identify a specific PCA an operator can turn an LED on or off for a short period of time, thus allowing correct identification of the PCA.

Since the LED is mounted on the PCB, both visual and physical access to the LED (or LEDs) is normally limited. For example, in order for a user to see the LED, holes must be drilled through the bulkhead of the PCA. The LED may then shine through the hole allowing a user to have visual feedback with regard to the status of the PCA. Sometimes, a light diffusing pipe is used in conjunction with the hole in the bulkhead of the PCA to allow a better view of the LED.

One deleterious effect of drilling a hole through the bulkhead of a PCA in order to observe the LED is the lack of uniformity between LED locations per PCA. For example, there is no cPCI industry standard for the location of the LED(s). Therefore, whoever designs the system (or PCA) must also establish the location(s) of the LED(s), design the bulkhead with the correct hole location(s), and choose whether or not to use a light diffusing pipe (or pipes) in conjunction with the LED(s).

In addition to the custom bulkhead requirements mentioned above, since there is no industry standard LED location, users (e.g., administrators and service personnel) can never be sure of the location of the LED with respect to the bulkhead. Therefore, a user may believe the blue LED is off and the PCA is ready for hot swapping, but infact, they may be looking through the wrong hole or at the wrong LED. In such a case, the PCA may be removed prematurely and damage to components within the PCA may occur.

Another problem with the use of LEDs on a PCB is the amount of room they require. For example, not only does the LED take up space on the PCB but other connectors, cables, indicators, and the like, must be carefully placed around the LED and the viewing hole for the LED to ensure there is no blockage of the light from the LED to the bulkhead. Moreover, the bulkhead of the PCA also has limited room. Therefore, drilling a hole (or holes) in the bulkhead (in order to establish a viewing window for the LED) leaves less room for connectors, labels, communication ports, and the like.

Thus, the utilization of LEDs is non-standard, time-consuming, and lacks the desired "Design for Manufacturability."

DISCLOSURE OF THE INVENTION

The present invention provides an ejector latch indicator light method and apparatus which establishes a conventional location for LEDs. The present invention also provides an ejector latch indicator light method and apparatus which achieves the above accomplishment and which facilitates utilization of a standard bulkhead having no visual port. The present invention also provides an ejector latch indicator light method and apparatus which achieves the above accomplishments and which can be adapted to readily interface with industry standard components and meet industry standard specifications.

Specifically, an ejector latch indicator light assembly for reducing the interference by a bulkhead of light emitted from an indicator light is disclosed. In one embodiment, the present invention is comprised of an ejector latch. The present embodiment is further comprised of an indicator light integrated with the ejector latch. The indicator light is adapted to emit light from the ejector latch such that interference by the bulkhead of the light emitted from the indicator light is reduced.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

BEST MODES FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

With reference now to FIGS. 1A–3B, side views of ejector latch indicator light assemblies in accordance with embodiments of the present claimed invention are shown. The following discussion will begin with a detailed description of the physical characteristics of the present ejector latch indicator light assemblies. The discussion will then contain a detailed description of the use and operation of the present ejector latch indicator light assemblies. Regarding the physical structure of the present ejector latch indicator light assemblies, for purposes of clarity, only one side of the ejector latch indicator light assemblies (e.g., 100 through 350) are shown in FIGS. 1A–3B. In the present embodiment ejector latch indicator light assemblies (e.g., 100 through 350) includes an ejector latch 105. Importantly, as will be discussed in detail below, in one embodiment, ejector latch 105 is formed having dimensions and characteristics which are in compliance with an industry standard such as, for example, the compact peripheral component interconnect (cPCI) standard, and the VersaModular Eurocard (VME) standard.

Figure 1A:
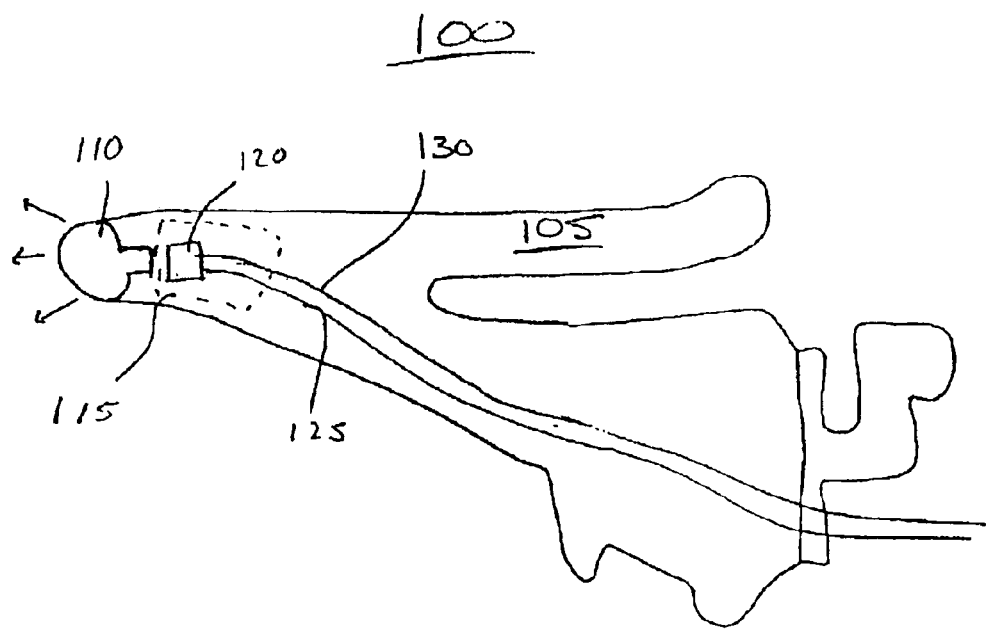
FIGS. 1A and 1B are side views of ejector latch indicator light assemblies in accordance with embodiments of the present claimed invention.
Figure 1B:
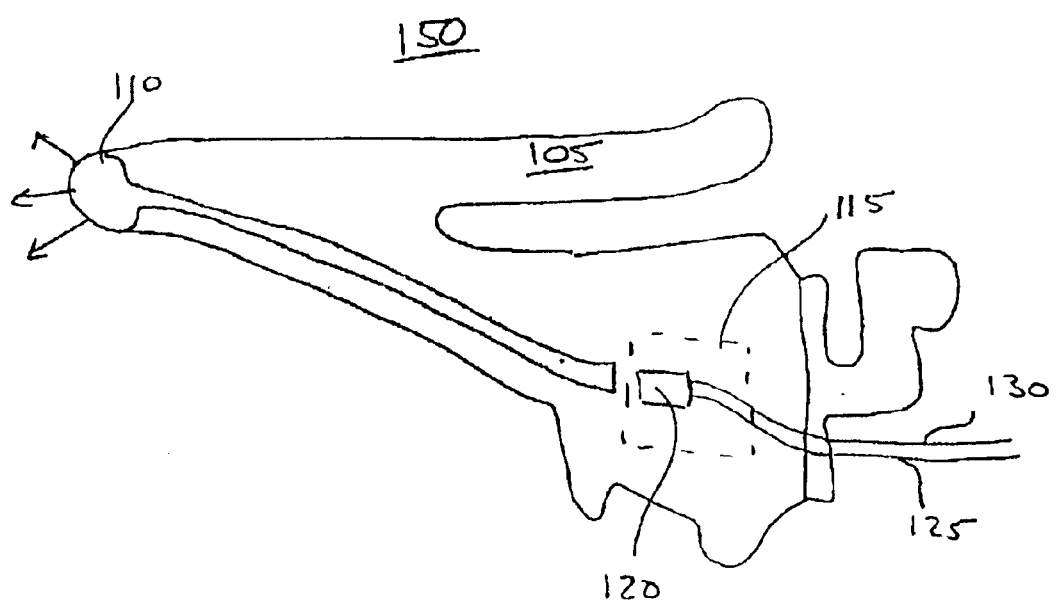

Referring now to FIG. 1A, ejector latch indicator light assembly 100 also includes an indicator light 115 that is integrated with ejector latch 105. In one embodiment, indicator light 115 is comprised of a light-emitting diode (LED). Indicator light 115 is ultimately employed as a status indicator for a printed circuit assembly (PCA) to which it is coupled. Although an LED is specifically mentioned as the indicator light 115 in the present embodiment, the indicator light 115 is also well suited to use with various other types of indicator lights including, for example, light bulbs, and the like. For purposes of brevity and clarity each of the numerous possibilities of indicator lights are not shown in the present Figures. As shown in FIGS. 1A and 1B, indicator light 115 is comprised of a head portion 120, and an electrical wire (e.g., 125 and 130). As will be discussed below in detail, in one embodiment (e.g., FIG. 2A and FIG. 3A), head portion 120 is adapted to be arranged flush with ejector latch 105. Indicator light 115 is adapted to emit light from ejector latch 105 such that the light is not interfered with by a bulkhead to which ejector latch 105 is adapted to be coupled. FIGS. 5A–5G illustrate other embodiment of the present invention in which a plurality of indicator lights 115 are adapted to emit light from said ejector latch 105 to reduce the interference of the light emitted from the indicator light 115 with respect to a bulkhead.

With reference still to FIG. 1A, in one embodiment ejector latch indicator light assembly 100 also includes a light diffusing pipe 110 integrated with ejector latch 105. Light diffusing pipe 110 is employed to direct the light from indicator light 115 to the outside of ejector latch 105. In one embodiment, light diffusing pipe 110 may be an optical fiber, light channel, or the like. As illustrated in FIG. 1B and FIG. 3B, light diffusing pipe 110 may be of sufficient length to allow variable placement of indicator light 115. In other embodiments (e.g., FIG. 2A, FIG. 2B and FIG. 3A), light diffusing pipe 110 is optional, and indicator light 115 may be used without light diffusing pipe 110 without detrimental operation.

Figure 4A:
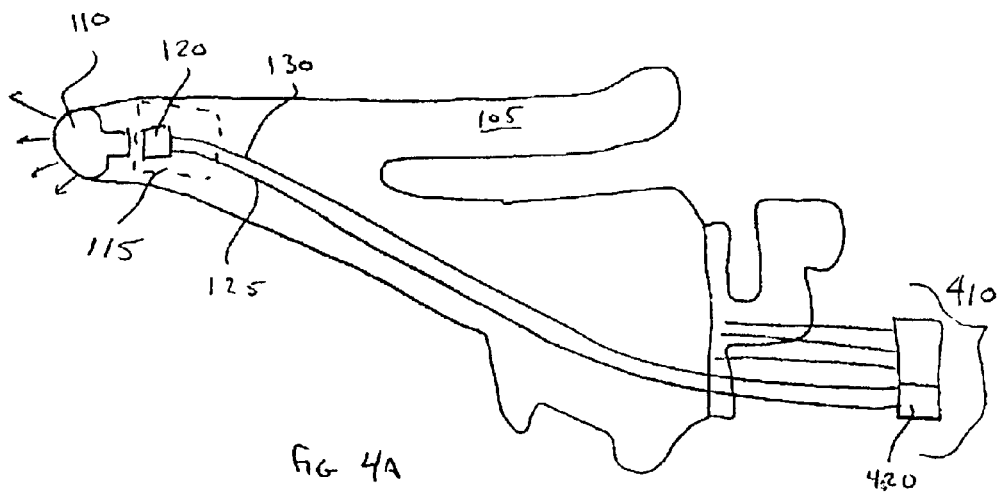
FIGS. 4A and 4B are side views of ejector latch indicator light assemblies in accordance with embodiments of the present claimed invention.
Figure 4B:
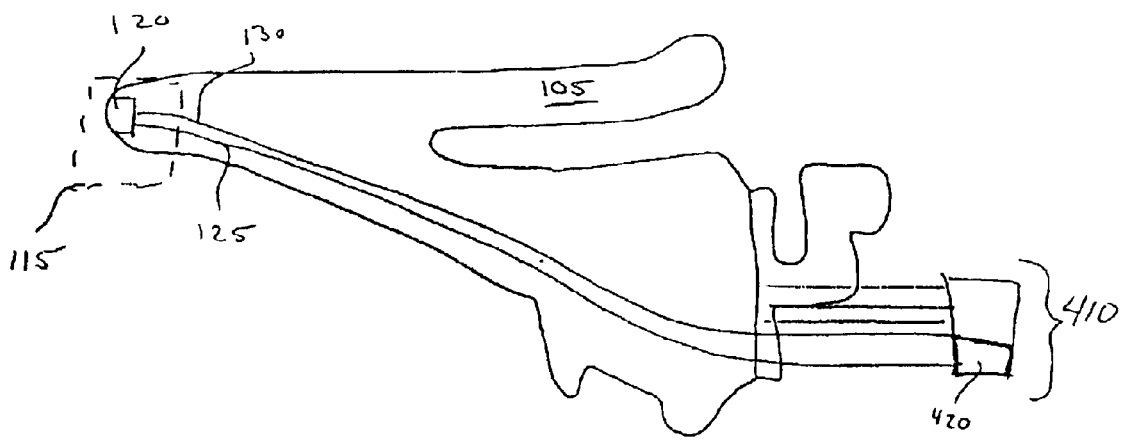

Ejector latch indicator light assembly 100 of FIG. 1A also includes electrical wire 125 and electrical wire 130 which are coupled to head portion 120 of indicator light 115. Electrical wire 125 and electrical wire 130 electrically couple head portion 120 with a printed circuit board (PCB) or a printed circuit assembly (PCA). Electrical wire 125 and electrical wire 130 are employed to transmit the signals that control head portion 120 which may be received from the PCB or PCA. With reference now to FIGS. 4A and 4B, a current limiting resistor 420 may be coupled to electric wire (e.g., 125 and 130). In one embodiment, current limiting resistor 420 is coupled with an integrated switch that terminates at a PCB connector 410. Current limiting resistor 420 allows the utilization of a plurality of voltage levels to activate indicator light 115. For example, indicator light 115 may be set to operate at 1.5, 3.3, or 5 volts. Further details of current limiting resistor 420 are described herein.

Use and Operation

The following is a detailed description of the use and operation of the present ejector latch indicator light assembly. With reference again to FIG. 1A, in one embodiment, indicator light 115 is integrated with an ejector latch such as ejector latch 105. In one embodiment (e.g., FIG. 1A), indicator light 115 is integrated with ejector latch 105 proximate to the end of ejector latch 105, and a light diffusing pipe 110 is used to diffuse the light emitted from indicator light 115. In another embodiment (e.g., FIG. 1B), indicator light 115 is integrated with ejector latch 105 at a point other than the end of ejector latch 105 and a light diffusing pipe 110 is used to transmit the light from indicator light 115 to the end of ejector latch 105. In yet another embodiment (e.g., FIG. 3B), indicator light 115 is integrated with ejector latch 105 at a point other than the end of ejector latch 105 and a light diffusing pipe 110 is used to transmit the light from indicator light 115 to an outside portion of ejector latch 105.

Figure 2A:
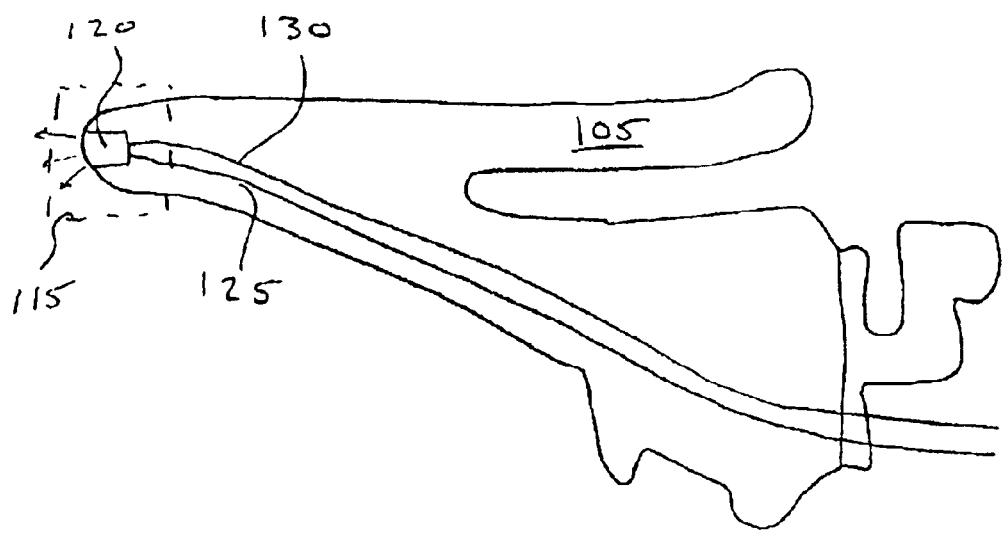
FIGS. 2A and 2B are side views of ejector latch indicator light assemblies in accordance with embodiments of the present claimed invention.
Figure 2B:
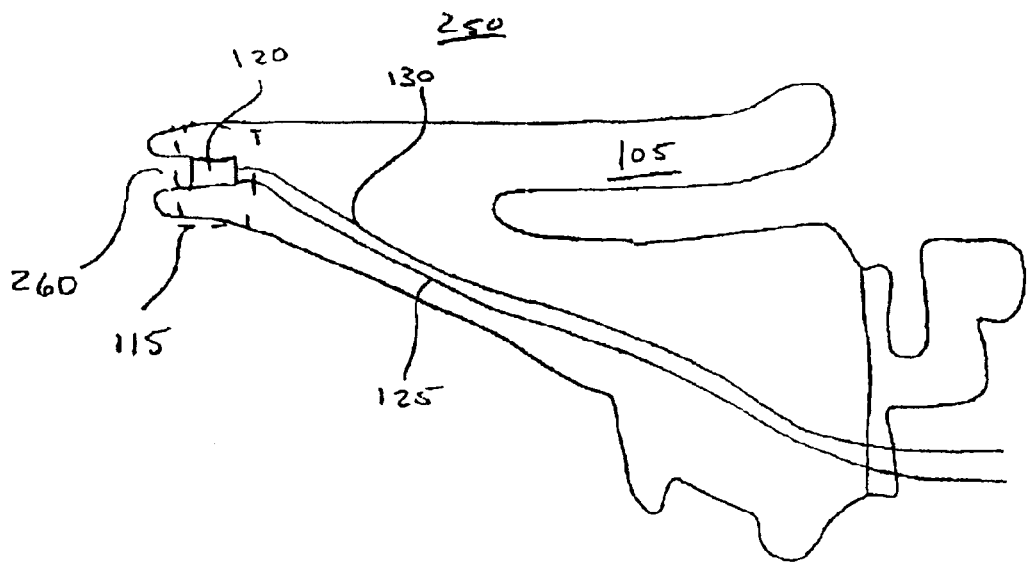
Figure 3A:
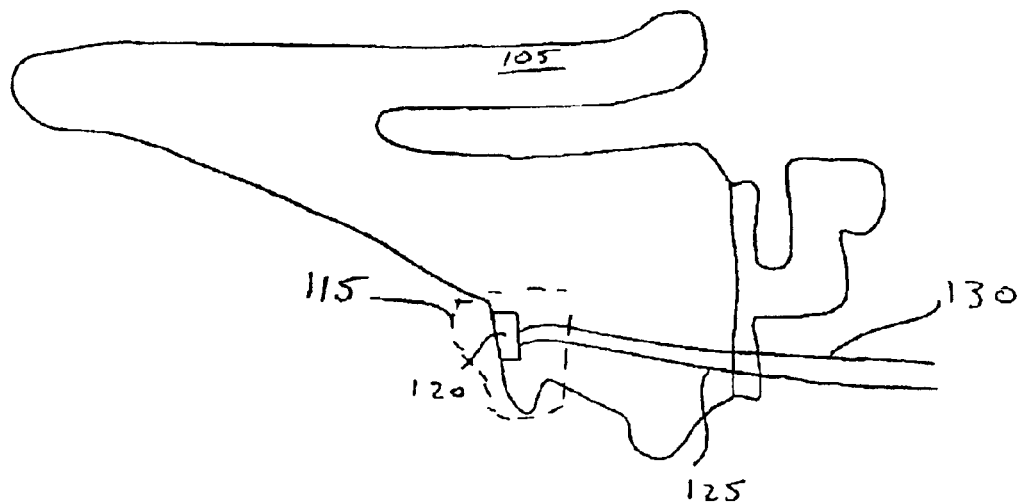
FIGS. 3A and 3B are side views of ejector latch indicator light assemblies in accordance with embodiments of the present claimed invention.
Figure 3B:
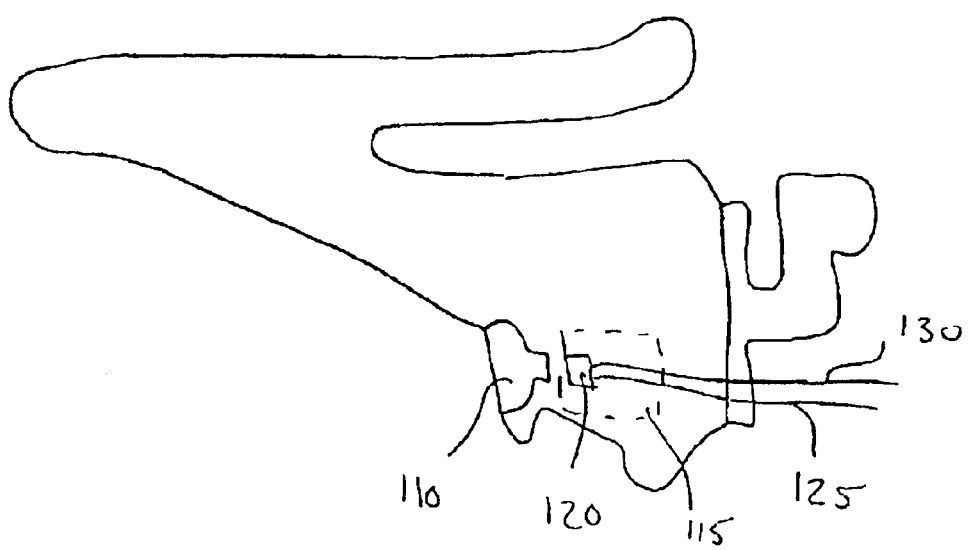

FIG. 2A illustrates an embodiment in which indicator light 115 is integrated with ejector latch 105 such that the top surface of head portion 120 is flush with ejector latch 105. In another embodiment (e.g., FIG. 2B), head portion 120 is inset from the outside surface of ejector latch 105 and an opening (or channel) 260 is utilized to allow the light from indicator light 115 to be emitted. Furthermore, as shown in FIG. 3B, in one embodiment, indicator light 115 may be flush with an outside portion of ejector latch 105 at a point other than the end of ejector latch 105.

Importantly, the present invention is well suited to integrating indicator light 115 with an ejector latch 105 in order that indicator light 115 will remain visible to a user by offsetting the indicator light 115 from the PCA bulkhead. In addition, the present embodiment further allows the location of indicator light 115 to become standard. Therefore, unlike prior art approaches, the present embodiment does not arbitrarily choose the location of indicator light(s) 115. In addition, unlike prior art approaches, the present embodiment does not require post manufacture of standard PCA bulkheads in order to establish visual ports for viewing indicator lights. Instead, the present embodiment allows customers to realize the beneficial reduced visual interference achieved with the present embodiment, while utilizing the particular PCA bulkhead of the customer's choice. For example, ejector latch 105 is well suited to use with various types of bulkheads having cables and electrical connections which are removably coupled thereto, and also bulkheads having cables and electrical connections which are integral therewith without detrimentally effecting the visual properties of the indicating light source.

With reference now to FIGS. 1A through 4B, in one embodiment indicator light 115 includes a head portion 120 and an electrical wire portion (e.g., 125 and 130). Electrical wire portion (e.g., 125 and 130) are electrically coupled with a PCA or PCB such that the signals that activate head portion 120 may be received from the PCA or PCB. Furthermore, with reference to FIGS. 4A and 4B, in one embodiment electrical wire (e.g., 125 and 130) electrically couple with a PCA or PCB via an integrated switch that terminates at a PCB connector 410. In general, PCB connector 410 is a standard link tab that corresponds to mounting holes disposed on a PCB or a computer chassis and is utilized to signal the open or closed status of ejector latch 105. As a result, the present invention allows electric wire (e.g., 125 and 130) of indicator light 115 to be coupled to the PCA or PCB via PCB connector 410 without concern for deleterious rewiring or remanufacture of ejector latch 105 or the PCA or PCB to which it may attach.

Referring still to FIGS. 4A and 4B, a current limiting resistor 420 may be coupled to electric wire (e.g., 125 and 130). In one embodiment, current limiting resistor 420 is coupled with the integrated switch that terminates at a PCB connector 410. In general, current limiting resistor 420 allows the utilization of a plurality of voltage levels to activate indicator light 115. For example, one electric wire (e.g., 125) may have a current and ground connection. The other (e.g., electric wire 130) may be coupled with a current limiting resistor 420. Thus, different voltage levels (e.g., 1.5, 3.3, 5, or the like) may be used within the PCA to drive the indicator light 115 while the current limiting resistor 420 limits the current reaching indicator light 115 to the appropriate level.

Figure 5A:
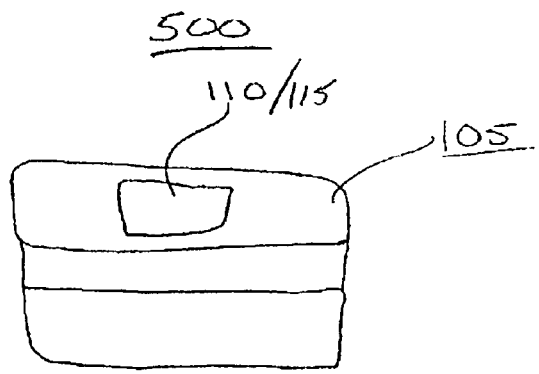
FIGS. 5A through 5G are front views of ejector latch indicator light assemblies in accordance with embodiments of the present claimed invention.
Figure 5B:
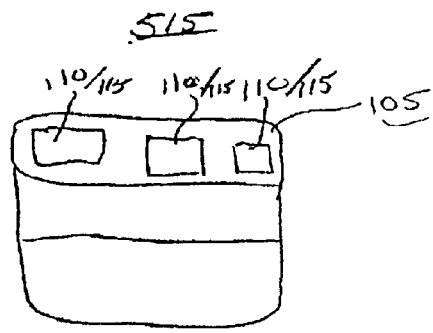
Figure 5C:
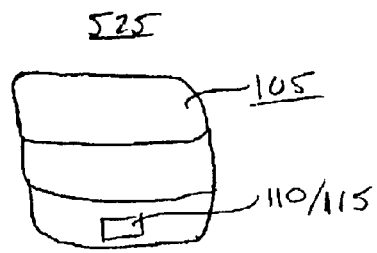
Figure 5D:
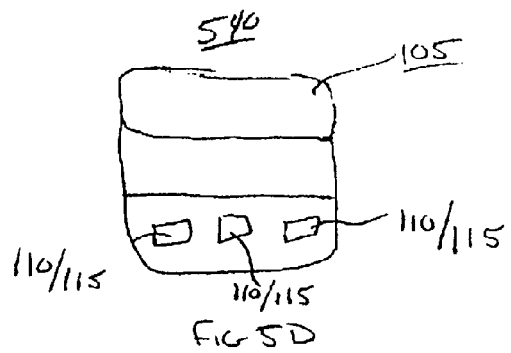
Figure 5E:
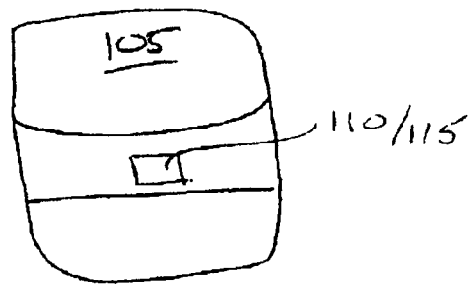
Figure 5F:
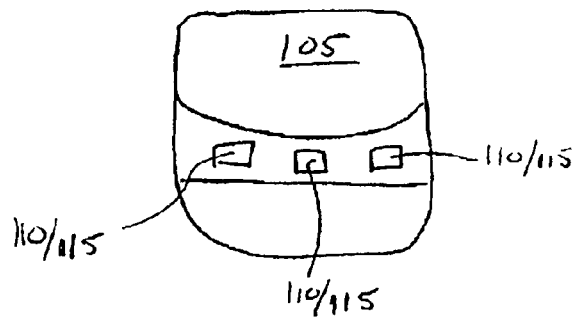
Figure 5G:
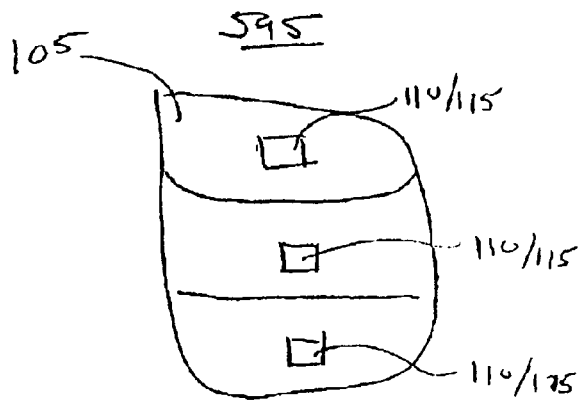

With reference now to FIGS. 5A–5G front views of ejector latch indicator light assemblies are shown. Specifically, examples of embodiments in which the present invention utilizes differing locations for indicator light 115 and one or more indicator lights 115 are illustrated. As shown in FIGS. 5A, 5C, and 5E, indicator light 115 may be located at a plurality of locations within (or upon) ejector latch 105. In addition, indicator light 115 may utilize a light diffusing pipe 110 for transmitting the light from indicator light 115 through ejector latch 105. For example, to indicate the hot swap status, a blue LED may be integrated with ejector latch 105.

Moreover, as shown in FIGS. 5B, 5D, 5E, and 5G, a plurality of indicator lights 115 may be located at a plurality of locations within (or upon) ejector latch 105. In addition, some or all of the plurality of indicator lights 115 may utilize light diffusing pipe 110. For example, if a plurality of indicators are selected to show the operational status of the PCA (e.g., indicating hot swapping status, indicating local area network (LAN) connectivity, connection speeds (e.g., 10 megabits, 100 megabits, 1000 megabits, etc.), power on or off, or the like), then they may all be integrated with ejector latch 105 and located at a plurality of locations thereon.

Figure 6:
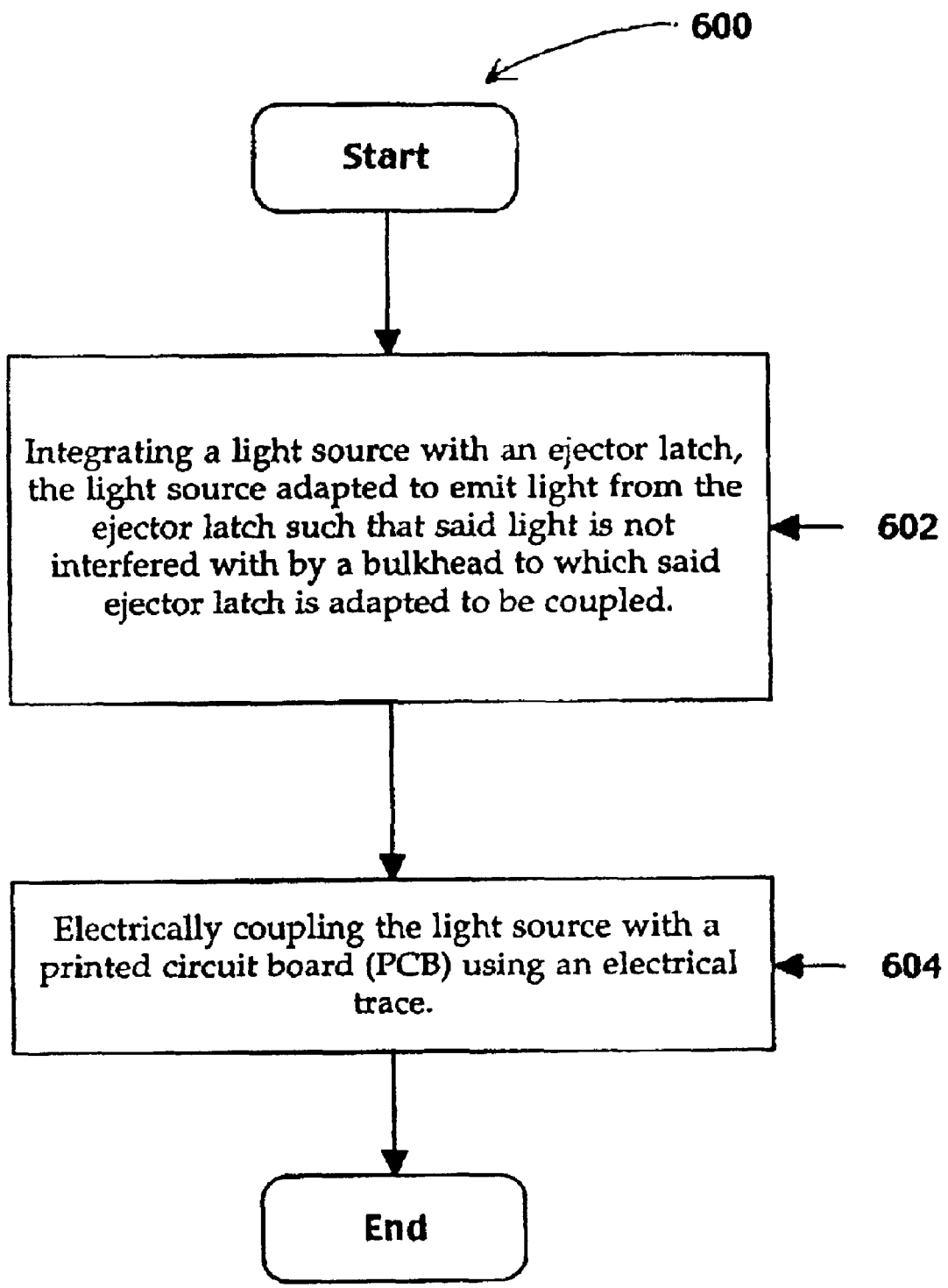
FIG. 6 is a flow chart of steps performed in accordance with one embodiment of the present claimed invention.

With reference now to FIG. 6, a flow chart 600 summarizing the steps performed in accordance with one embodiment of the present invention is shown. At step 602, the present embodiment integrates an indicator light with an ejector latch. As described in detail above, the indicator light (e.g. indicator light 115) is adapted to emit light from the ejector latch such that the light is not interfered with by a bulkhead to which the ejector latch is adapted to be coupled.

Next, at step 604, the present embodiment then electrically couples the indicator light with a PCB using an electrical wire. Beneficially, the present embodiment eliminates the need to custom fit each bulkhead of a PCA with the specific PCB and indicator light locations thereon. Instead, the present embodiment allows PCA assemblies to be independently manufactured without concern for the subsequent location of indicator lights or the bulkhead being utilized. Furthermore, with the relocation of the indicating light (e.g., LED) more room is available on the PCB and the manufacturing requirements are reduced since connectors, cables, indicators, and the like will no longer block the indicator light from being viewed. Thus, the present invention achieves a "Design for Manufacturability" lacking in the prior art. Additionally, by reducing visual interference and standardizing the location of the hot swap indicator, the present invention is extremely well suited to use in hot swapping environments.

Thus, the present invention provides an ejector latch indicator light method and apparatus which establishes a conventional location for LEDs. The present invention also provides an ejector latch indicator light method and apparatus which achieves the above accomplishment and which facilitates utilization of a standard bulkhead having no visual port. The present invention also provides an ejector latch indicator light method and apparatus which achieves the above accomplishments and which can be adapted to readily interface with industry standard components and meet industry standard specifications.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An ejector latch indicator light assembly comprising:
   an ejector latch; and
   an indicator light integrated with said ejector latch, said indicator light adapted to emit light from said ejector latch such that said light is not interfered with by a bulkhead to which said ejector latch is adapted to be coupled, wherein said indicator light is comprised of:
   a head portion; and
   an electrical wire coupled to said head portion, said electrical wire adapted to electrically couple said head portion with a printed circuit board (PCB) such that a signal from said PCB may be received by said head portion.

2. The ejector latch indicator light assembly of claim 1 wherein said indicator light is a light-emitting diode (LED).

3. The ejector latch indicator light assembly of claim 1 further comprising:
a plurality of said indicator lights integrated with said ejector latch, said plurality of indicator lights adapted to emit light from said ejector latch with respect to said bulkhead such that interference by said bulkhead of said light emitted from said indicator lights is reduced.

4. The ejector latch indicator light assembly of claim 1 wherein said ejector latch will couple with said bulkhead in accordance with a compact peripheral component interconnect (CPCI) standard.

5. The ejector latch indicator light assembly of claim 1 wherein said ejector latch will couple with said bulkhead in accordance with a VersaModular Eurocard (VME) standard.

6. The ejector latch indicator light assembly of claim 1 wherein said ejector latch is further comprised of:
a light diffusing pipe integrated with said ejector latch, said light diffusing pipe for directing said light emitted from said indicator light integrated with said ejector latch to the outside of said ejector latch.

7. The ejector latch indicator light assembly of claim 1 wherein said indicator light is coupled to said ejector latch such that said head portion is flush with said ejector latch.

8. The ejector latch indicator light assembly of claim 1 wherein said electrical wire is further comprised of:
a current limiting resistor coupled to said electrical wire, said current limiting resistor allowing the utilization of a plurality of voltage levels to activate said indicator light.

9. A method for reducing the interference by a bulkhead of light emitted from an indicator light comprising:
a) integrating an indicator light with an ejector latch, said indicator light adapted to emit light from said ejector latch such that a visual port is not required in said bulkhead to which said ejector latch is adapted to be coupled; and
b) electrically coupling said indicator light with a printed circuit board (PCB) using an electrical wire.

10. The method for reducing the interference by a bulkhead of light emitted from an indicator light as recited in claim 9 wherein said indicator light is a light-emitting diode (LED).

11. The method for reducing the interference by a bulkhead of light emitted from an indicator light as recited in claim 9 wherein said step a) comprises integrating said indicator light with said ejector latch such that said ejector latch will couple with said bulkhead in accordance with a compact peripheral component interconnect (cPCI) standard.

12. The method for reducing the interference by a bulkhead of light emitted from an indicator light as recited in claim 9 wherein said step a) comprises integrating said indicator light with said ejector latch such that said ejector latch will couple with said bulkhead in accordance with a VersaModular Eurocard (VME) standard.

13. The method for reducing the interference by a bulkhead of light emitted from an indicator light as recited in claim 9 wherein said step a) comprises coupling said indicator light with said ejector latch such that said indicator light is flush with said ejector latch.

14. The method for reducing the interference by a bulkhead of light emitted from an indicator light as recited in claim 9 wherein said step b) comprises electrically coupling said electrical wire to said PCB such that a signal from said PCB may be received by said indicator light.

15. The method for reducing the interference by a bulkhead of light emitted from an indicator light as recited in claim 9 wherein said electrical wire is further comprised of:
a current limiting resistor coupled to said electrical wire, said current limiting resistor allowing the utilization of a plurality of voltage levels to activate said indicator light.

16. An ejector latch indicator light assembly comprising:
an ejector latch; and
an indicator light integrated with said ejector latch, said indicator light adapted to emit light from said ejector latch with respect to a bulkhead such that said light is not interfered with by a bulkhead to which said ejector latch is adapted to be coupled said indicator light comprised of:
a head portion; and
an electrical wire coupled to said head portion, said electrical wire adapted to electrically couple said head portion with a printed circuit board (PCB) such that a signal from said PCB may be received by said head portion.

17. The ejector latch indicator light assembly of claim 16 wherein said indicator light is a light-emitting diode (LED).

18. The ejector latch indicator light assembly of claim 16 wherein said ejector latch will couple with said bulkhead in accordance with a compact peripheral component interconnect (cPCI) standard.

19. The ejector latch indicator light assembly of claim 16 wherein said ejector latch will couple with said bulkhead in accordance with a VersaModular Eurocard (VME) standard.

20. The ejector latch indicator light assembly of claim 16 wherein said indicator light is coupled to said ejector latch such that said head portion of said indicator light is flush with said ejector latch.

21. The ejector latch indicator light assembly of claim 16 wherein said head portion is further comprised of:
a light diffusing pipe integrated with said ejector latch, said light diffusing pipe for directing said light emitted from said indicator light integrated with said ejector latch to the outside of said ejector latch.

22. The ejector latch indicator light assembly of claim 16 further comprising:
a current limiting resistor coupled to said electrical wire, said current limiting resistor allowing the utilization of a plurality of voltage levels to activate the indicator light.

* * * * *